United States Patent
Saito (10) Patent No.: US 10,560,653 B2
(45) Date of Patent: Feb. 11, 2020

(54) IMAGE SENSING APPARATUS AND CONTROL METHOD FOR PERFORMING ANALOG-TO-DIGITAL CONVERSION

(71) Applicant: CANON KABUSHIKI KAISHA, Tokyo (JP)

(72) Inventor: Makiko Saito, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/944,203

(22) Filed: Apr. 3, 2018

(65) Prior Publication Data

US 2018/0295307 A1    Oct. 11, 2018

(30) Foreign Application Priority Data

Apr. 7, 2017 (JP) ................................ 2017-076819

(51) Int. Cl.
| | |
|---|---|
| *H04N 5/378* | (2011.01) |
| *H04N 5/357* | (2011.01) |
| *H03M 1/18* | (2006.01) |
| *H04N 5/363* | (2011.01) |
| *H04N 5/3745* | (2011.01) |

(Continued)

(52) U.S. Cl.
CPC ....... *H04N 5/378* (2013.01); *H01L 27/14612* (2013.01); *H03M 1/182* (2013.01); *H04N 5/243* (2013.01); *H04N 5/3575* (2013.01); *H04N 5/363* (2013.01); *H04N 5/37455* (2013.01); *H04N 5/37457* (2013.01); *H03M 1/123* (2013.01); *H03M 1/56* (2013.01); *H04N 5/355* (2013.01)

(58) Field of Classification Search
CPC ...... H04N 5/378; H04N 5/3575; H04N 5/363; H04N 5/37455; H04N 5/243; H04N 5/37457; H04N 5/355; H04N 5/35527; H04N 5/35518; H03M 1/182; H03M 1/123; H03M 1/56; H01L 27/14612
See application file for complete search history.

(56) References Cited

U.S. PATENT DOCUMENTS

| | | | |
|---|---|---|---|
| 8,922,668 B2* | 12/2014 | Ota ........................ | H04N 5/357 348/222.1 |
| 9,264,634 B2* | 2/2016 | Oike ...................... | H03M 1/186 |

(Continued)

FOREIGN PATENT DOCUMENTS

| | | |
|---|---|---|
| JP | 2004-015701 A | 1/2004 |
| JP | 2015-164278 A | 9/2015 |

*Primary Examiner* — Albert H Cutler
(74) *Attorney, Agent, or Firm* — Carter, DeLuca & Farrell LLP (57) ABSTRACT

An image sensing apparatus comprises: a pixel unit; a generator that generates and outputs a plurality of reference signals having different slopes from each other that increase in proportion to elapsation of time; a selector that selects one of the plurality of reference signals; and an analog-to-digital converter that converts an analog signal outputted from the pixel unit of an image sensor to a digital signal using the reference signal selected by the selector, wherein the generator generates the plurality of reference signals in parallel, and in a case where an analog signal of a reset level is outputted from the pixel unit, the selector changes the reference signal selected from the plurality of reference signals each time the selected reference signal exceeds the analog signal.

5 Claims, 7 Drawing Sheets

(51) Int. Cl.
*H01L 27/146* (2006.01)
*H04N 5/355* (2011.01)
*H03M 1/12* (2006.01)
*H03M 1/56* (2006.01)
*H04N 5/243* (2006.01)

(56) References Cited

U.S. PATENT DOCUMENTS

| | | | |
|---|---|---|---|
| 10,205,901 B2* | 2/2019 | Murata | H04N 5/378 |
| 2014/0175263 A1* | 6/2014 | Muto | H04N 5/35527 |
| | | | 250/208.1 |
| 2017/0195607 A1* | 7/2017 | Bulteel | H04N 5/378 |
| 2018/0323795 A1* | 11/2018 | Xhakoni | H03M 1/182 |

* cited by examiner

IMAGE SENSING APPARATUS AND CONTROL METHOD FOR PERFORMING ANALOG-TO-DIGITAL CONVERSION

BACKGROUND OF THE INVENTION

Field of the Invention

The present invention relates to an image sensing apparatus and a control method therefor, and in particular, to an image sensing apparatus and a control method that perform analog-to-digital conversion.

Description of the Related Art

For image sensing apparatuses such as digital cameras, image sensors such as CMOS image sensors are widely used. In the CMOS image sensor, before reading out a pixel signal, a reset operation is performed to reset the signal holding capacitor of each pixel to a predetermined potential (reset level) by turning on/off a reset switch provided for each pixel. The reset levels of pixels vary between the pixels and between the reset operations due to the kTC noise of the reset switches. Variation of the reset levels between the pixels is superimposed on the image signal as random noise, which causes deterioration of the image quality. As a method for eliminating such variation in the reset level, a technique called S-N process is known. In this method, a reset level N is read out before reading a signal level S to which an image capture signal corresponding to a subject is reflected for each pixel, and the reset level N is subtracted from the signal level S.

Furthermore, along with demands for high sensitivity and high dynamic range of an image sensing apparatus, further improvement of an S/N ratio of a signal is required for the image sensor. In view of this, Japanese Patent Laid-Open No. 2004-15701 discloses an image sensor that determines the level of a voltage Vs corresponding to the signal level S and switches an amplification factor of an amplifier circuit provided in a readout circuit according to the determination result. As a result, it is possible to improve the S/N ratio by increasing the bit precision without extending a time for A/D conversion.

On the other hand, as another method for enhancing the bit precision of the A/D conversion in a short time, there is a driving method for speeding up the A/D conversion when a high luminance signal is inputted by selecting a slope of a reference signal Ramp used for comparison according to the signal level S in the image sensor having the gradient type A/D conversion circuit. In such a case, in order to accurately perform the S-N process described above, it is desirable to use a digital value of the reset level N that has undergone the A/D conversion using a reference signal having the same slope as a reference signal selected for each pixel and for every readout operation according to the determination result of the level of the voltage Vs. Japanese Patent Laid-Open No. 2015-164278 discloses a technique in which prior to the determination of the level of the voltage Vs corresponding to the signal level S and the A/D conversion, a voltage Vn corresponding to the reset level N is converted into digital values using a plurality of reference signals. In the case where the above method is applied to the technique described in Japanese Patent Laid-Open No. 2004-15701, in the A/D conversion operation of the reset level N, the amplification factor of the amplification circuit is switched to perform the A/D conversion a plurality of times.

However, according to the related art disclosed in Japanese Patent Laid-Open No. 2015-164278, since the A/D conversion is performed on the reset voltage Vn a plurality of times by using a plurality of reference signals generated in time series, the number of A/D conversion operation performed on the reset level N increases and the time required for signal readout increases. Therefore, at least a part of the effect of speeding up the A/D conversion performed on the signal level S is canceled out.

SUMMARY OF THE INVENTION

The present invention has been made in consideration of the above situation, and performs A/D conversion on a reset level using a plurality of reference signals without extending a time taken for A/D conversion operation.

Further, the present invention performs A/D conversion on reset levels amplified by a plurality of amplification factors, respectively, without extending a time taken for A/D conversion operation.

According to the present invention, provided is an image sensing apparatus comprising: a pixel unit; a generator that generates and outputs a plurality of reference signals having different slopes from each other that increase in proportion to elapsation of time; a selector that selects one of the plurality of reference signals; and an analog-to-digital converter that converts an analog signal outputted from the pixel unit to a digital signal using the reference signal selected by the selector, wherein the generator generates the plurality of reference signals in parallel, and in a case where an analog signal of a reset level is outputted from the pixel unit, the selector changes the reference signal selected from the plurality of reference signals each time the selected reference signal exceeds the analog signal.

Further, According to the present invention, provided is an image sensing apparatus comprising: a pixel unit; a generator that generates and outputs a reference signal having a slope that increases in proportion to elapsation of time; an amplifier that amplifies an analog signal outputted from the pixel unit by one of a plurality of gains; and an analog-to-digital converter that converts the analog signal amplified by the amplifier to a digital signal using the reference signal, wherein, in a case where an analog signal of a reset level is outputted from the pixel unit, the amplifier changes the gain used for the amplification each time the selected reference signal exceeds the amplified analog signal of the reset level.

Furthermore, According to the present invention, provided is a control method for an image sensing apparatus that comprises a pixel unit; a generator capable of generating and outputting a plurality of reference signals having different slopes from each other that increase in proportion to elapsation of time, a selector that selects one of the plurality of reference signals, and an analog-to-digital converter that converts an analog signal outputted from the pixel unit to a digital signal using the reference signal selected by the selector, the method comprising, in a case where an analog signal of a reset level is outputted from the pixel unit, generating the plurality of reference signals in parallel; changing a reference signal selected from the plurality of reference signals; and converting the analog signal of the reset level to a digital signal using each of the selected reference signals, wherein the reference signal is changed each time the selected reference signal exceeds the analog signal.

Further, According to the present invention, provided is a control method for an image sensing apparatus that comprises a pixel unit; a generator that generates and outputs a reference signal having a slope that increases in proportion to elapsation of time, an amplifier that amplifies an analog signal outputted from the pixel unit by one of a plurality of gains, and an analog-to-digital converter that converts the analog signal amplified by the amplifier to a digital signal using the reference signal, the method comprising, in a case where an analog signal of a reset level is outputted from the pixel unit, changing the gain used for the amplification each time the selected reference signal exceeds the amplified analog signal of the reset level.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

First Embodiment

Figure 1A:
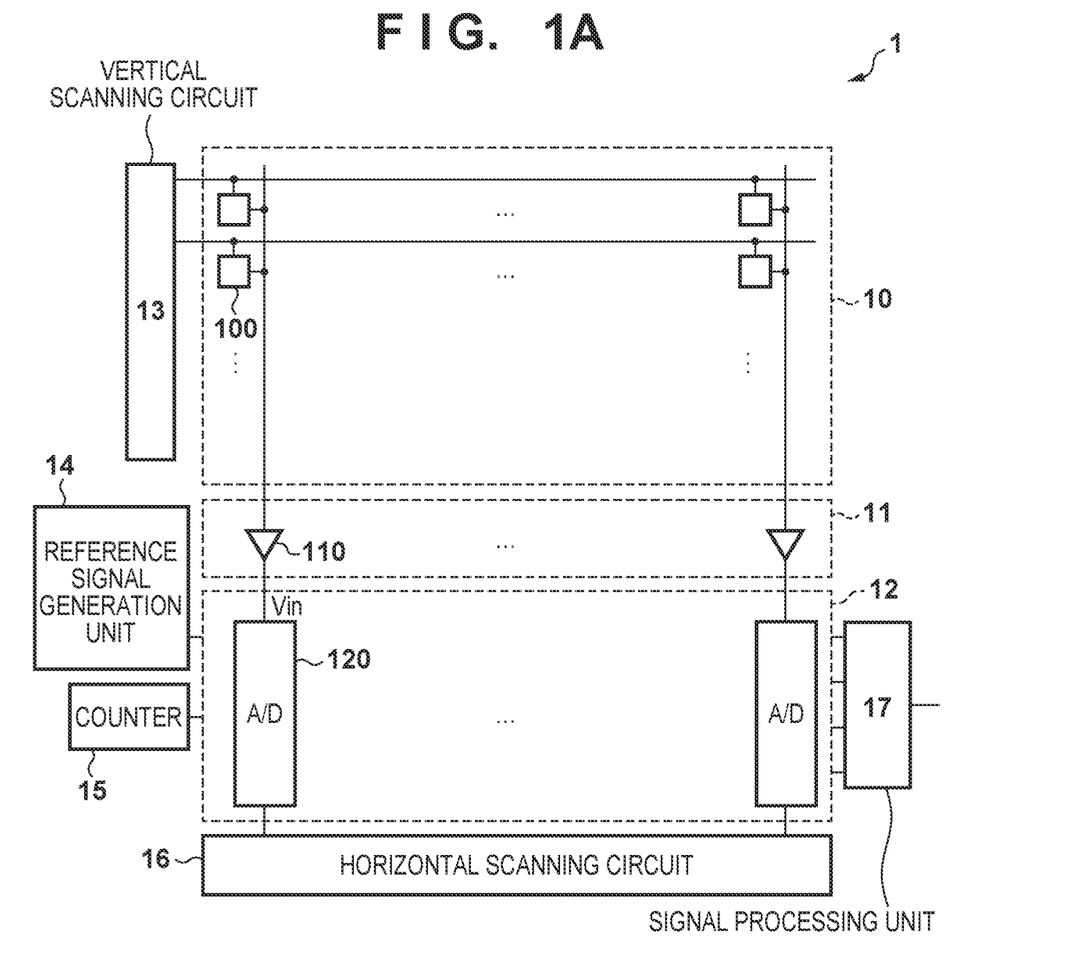
FIG. 1A is a block diagram showing a configuration of an image sensor.
Figure 1B:
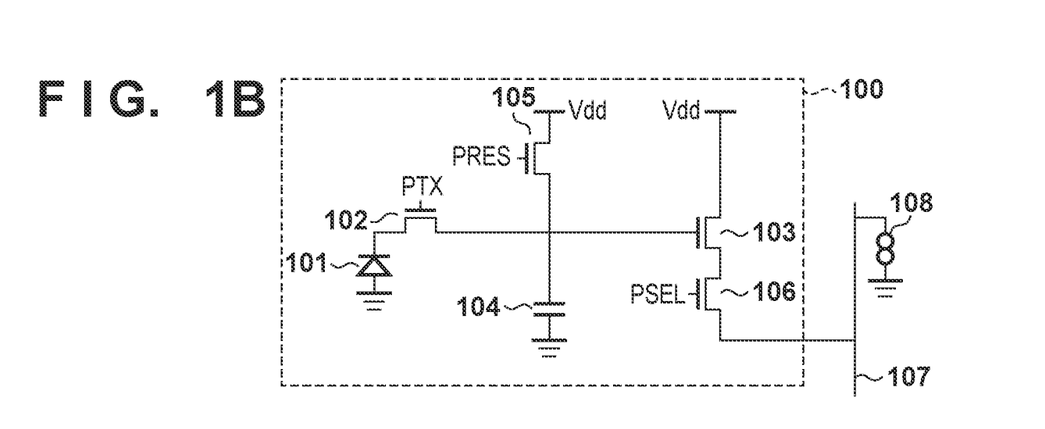
FIG. 1B is a circuit diagram showing a configuration of a pixel according to a first embodiment of the present invention.

Hereinafter, the configuration and driving of an image sensor according to the first embodiment of the present invention will be described. FIGS. 1A and 1B are diagrams showing the entire configuration of an image sensor 1 and a pixel circuit in the first embodiment. FIG. 1A is a block diagram showing the configuration of the image sensor 1. The image sensor 1 includes a pixel unit 10, an amplification unit 11, an A/D converter 12, a vertical scanning circuit 13, a reference signal generation unit 14, a counter 15, a horizontal scanning circuit 16, and a signal processing unit 17.

In the pixel unit 10, a plurality of pixels 100 are arranged in a matrix, and the driving thereof is controlled by various control signals outputted from the vertical scanning circuit 13. In the amplification unit 11, a plurality of amplifier circuits 110 are provided for pixel columns, respectively, and inversely amplify the voltage signals output from the pixels 100 and outputs them. Note that the amplifier circuits 110 are reset while the reset pulse PC0R (not shown) is at H level.

In the A/D converter 12, a plurality of A/D conversion circuits 120 are provided for the pixel columns, respectively, and perform A/D conversion to convert the voltage signals (analog signals) output from the amplification unit 11 into digital values (digital signals), and output them. A reference signal is supplied from the reference signal generation unit 14 to the A/D converter 12. The counter 15 is provided with a count circuit (not shown), and the count value of the count circuit is supplied to the A/D converter 12. The digital values converted by the A/D converter 12 are output according to the scanning signal supplied from the horizontal scanning circuit 16.

The signal processing unit 17 performs signal processing such as S-N process on the digital values output from the A/D converter 12, and outputs them to the outside of the image sensor 1.

FIG. 1B is an equivalent circuit diagram showing a circuit configuration of the pixel 100 of the image sensor 1 in the first embodiment. A photodiode 101 generates and accumulates charges corresponding to an amount of incident light. A transfer transistor 102 is controlled by a transfer pulse PTX from the vertical scanning circuit 13 and, when it is on, transfers the charge accumulated in the photodiode 101 to a floating diffusion capacitor 104.

An amplifying transistor 103 converts the charge signal held in the floating diffusion capacitor 104 into a voltage signal, amplifies the voltage signal, and outputs the voltage signal. A reset transistor 105 is controlled by a reset pulse PRES from the vertical scanning circuit 13, and resets the floating diffusion capacitor 104 to the power supply voltage Vdd when it is on. In addition, the photodiode 101 can be reset by simultaneously turning on the reset transistor 105 and the transfer transistor 102.

A selection transistor 106 is controlled by a selection pulse PSEL from the vertical scanning circuit 13 and selects the pixels 100 to be connected to vertical output lines 107. The vertical output line 107 transmits the voltage signal from the connected pixel 100 to the amplification unit 11 arranged in the subsequent stage. A current source 108 supplies current to the vertical output line 107.

Figure 2:
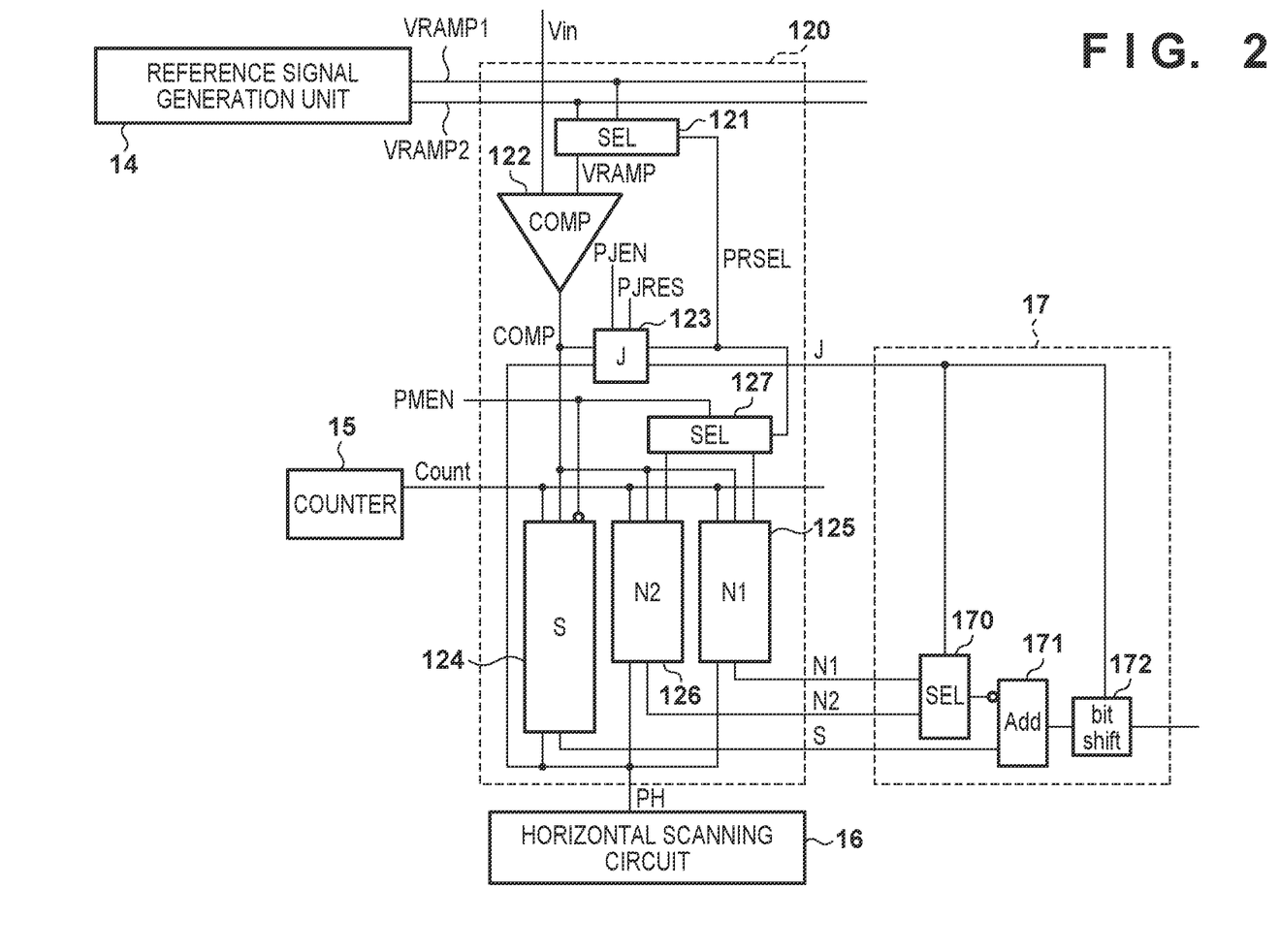
FIG. 2 is a block diagram showing a circuit configuration of an A/D conversion circuit and a signal processing unit of the image sensor according to the first embodiment.

FIG. 2 is a block diagram showing a circuit configuration of the A/D conversion circuit 120 and the signal processing unit 17 of the image sensor 1 according to the first embodiment.

In the first embodiment, the reference signal generation unit 14 can generate and output a plurality of reference signals. Here, it is assumed that the reference signal generation unit 14 generates a first reference signal VRAMP1 and a second reference signal VRAMP2.

A selection circuit 121 selects one of the plurality of reference signals (the first reference signal VRAMP1 and the second reference signal VRAMP2) output from the reference signal generation unit 14 according to a reference signal selection pulse PRSEL, and outputs it to a comparison circuit 122 as a reference signal VRAMP. Here, the first reference signal VRAMP1 is selected when the reference signal selection pulse PRSEL is at L level, and the second reference signal VRAMP2 is selected when the reference signal selection pulse PRSEL is at H level.

The comparison circuit 122 compares an input voltage Vin from the amplifier circuit 110 with the reference signal VRAMP selected by the selection circuit 121. When the reference signal VRAMP is lower than the input voltage Vin, L level is outputted, and when the reference signal VRAMP is equal to or higher than the input voltage Vin, H level is outputted.

A holding circuit 123 holds the reference signal selection pulse PRSEL. The holding circuit 123 holds H level as the reference signal selection pulse PRSEL at the timing when an output signal COMP from the comparison circuit 122 is inverted from L level to H level while an enable pulse PJEN is at H level. From this point on, it keeps H level irrespective of the output of the comparison circuit 122. Also, when a reset pulse PJRES becomes H level, the reference signal selection pulse PRSEL stored in the holding circuit 123 is reset to L level. Further, the holding circuit 123 holds a luminance judgment value J obtained by a luminance judging operation to be described later.

An inverted signal of an enable pulse PMEN is input to a memory 124, and writing is permitted while the enable pulse PMEN is at L level. Meanwhile, at the timing when the output signal COMP of the comparison circuit 122 is inverted from L level to H level, a count value input from the counter 15 is stored as a third digital value S.

The reference signal selection pulse PRSEL and the enable pulse PMEN are input to a selection circuit 127. While the reference signal selection pulse PRSEL is at L level, the enable pulse PMEN is input to a memory 125, and while the reference signal selection pulse PRSEL is at H level, the enable pulse PMEN is input to a memory 126.

Writing to the memory 125 is permitted while the enable pulse PMEN output from the selection circuit 127 is at H level. Meanwhile, at the timing when the output signal COMP of the comparison circuit 122 is inverted from L level to H level, the count value input from the counter 15 is stored as a first digital value N1.

Writing to the memory 126 is permitted while the enable pulse PMEN output from the selection circuit 127 is at H level. Meanwhile, at the timing when the output signal COMP of the comparison circuit 122 is inverted from L level to H level, the count value input from the counter 15 is stored as a second digital value N2.

A scanning signal PH is input to the holding circuit 123 and the memories 124, 125, 126 from the horizontal scanning circuit 16. Then, according to the scanning signal PH, the luminance judgment value J held in the holding circuit 123 and the digital values S, N1, N2 held in the memories 124, 125, and 126, respectively, are output to the signal processing unit 17.

A selection circuit 170 selects a digital value to be output to an addition circuit 171 provided in the subsequent stage. The selection circuit 170 selects and outputs one of the digital values N1 and N2 input from the A/D conversion circuit 120 based on the luminance judgment value J input from the holding circuit 123. Here, it is assumed that the selection circuit 170 outputs the digital value N1 when the luminance judgment value J is L level and outputs the digital value N2 when the luminance judgment value J is H level.

The addition circuit 171 adds the input signals to each other. The addition circuit 171 receives an inverted value of the output value of the selection circuit 170 and the digital value S output from the A/D conversion circuit 120, and the addition circuit 171 adds these values and outputs the result.

A bit shift circuit 172 bit-shifts the input digital value according to the luminance judgment value J input from the holding circuit 123 and outputs it. Here, the bit shift circuit 172 performs bit shift by x bits when the luminance judgment value J is L level and by 0 bit when the luminance judgment value J is H level.

Figure 3A:
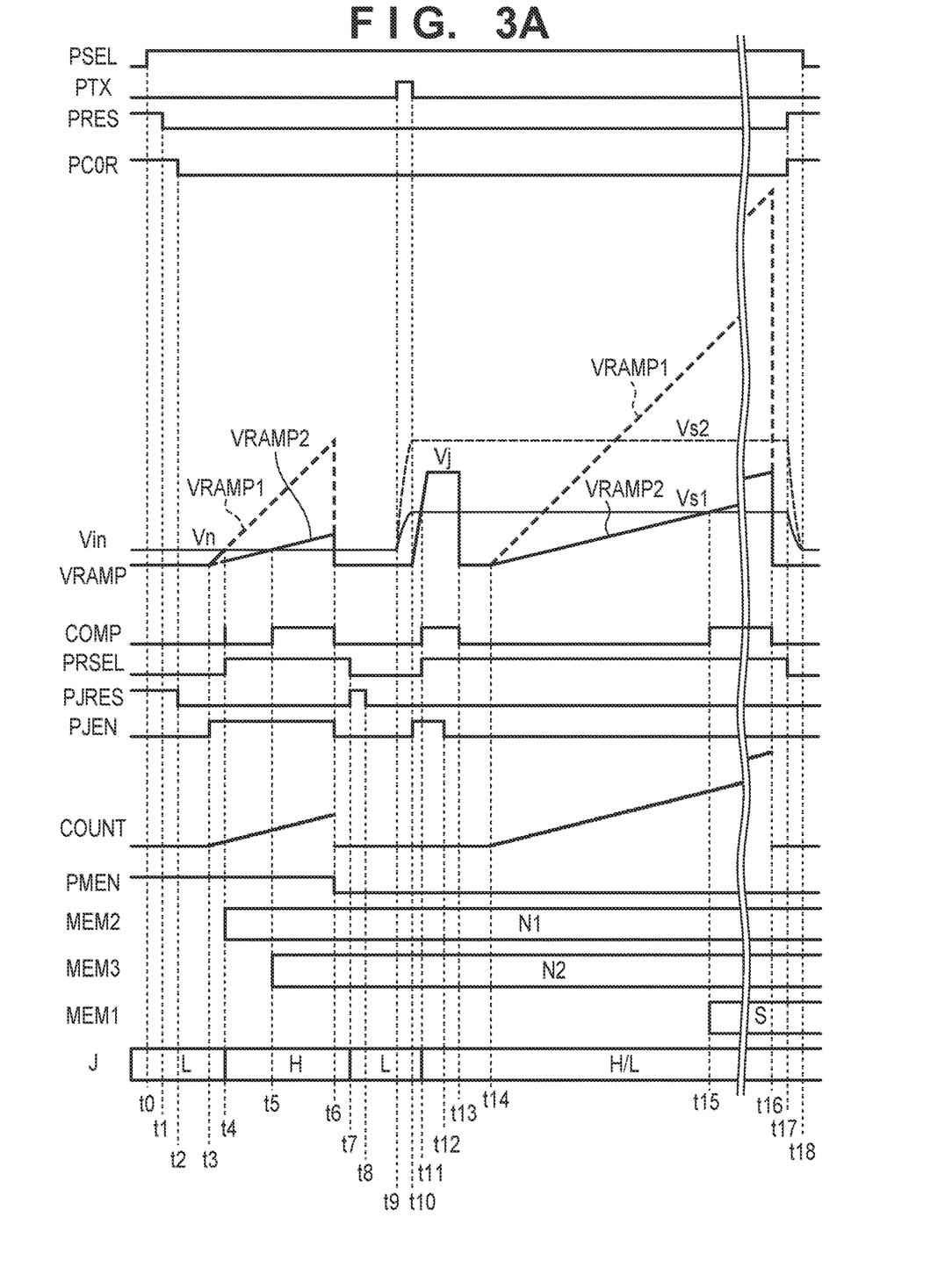
FIG. 3A is a timing chart showing a signal readout operation according to the first embodiment.
Figure 3B:
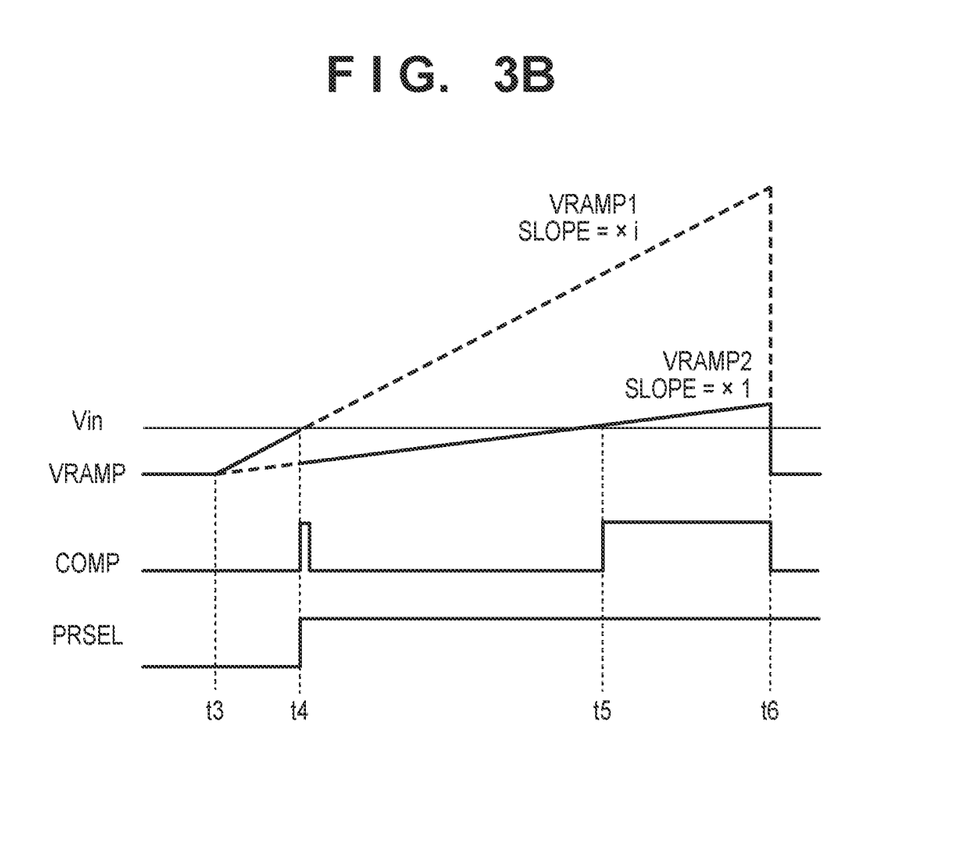
FIG. 3B is a timing chart showing a signal readout operation according to the first embodiment.

FIGS. 3A and 3B are timing charts showing a signal readout operation in the first embodiment, and FIG. 3A shows a timing chart of a readout operation of pixel signals for one row. Further, FIG. 3B is a timing chart in which the portion corresponding to the characteristic operation in the first embodiment is extracted from the timing chart of FIG. 3A and enlargedly displayed.

At time t0, the selection pulse PSEL of the pixels 100 is set to H level to turn on the selection transistor 106, and the pixels 100 in the desired row are connected to the vertical output lines 107.

At time t1, the reset pulse PRES of each of the pixels 100 in the selected row is set to L level to turn off the reset transistor 105, and the resetting of the floating diffusion capacitor 104 of the pixel 100 is ended. Voltage signals corresponding to the reset level are outputted from the pixels for which the resetting of the floating diffusion capacitor 104 is completed.

At time t2, a reset pulse PC0R of the amplifier circuit 110 is set to L level to end the resetting of the amplifier circuit 110. Further, the reset pulse PJRES to the holding circuit 123 is set to L level to end the resetting of the holding circuit 123. As a result, a voltage signal corresponding to the reset level of the pixel 100 is amplified by the amplifier circuit 110 and output as voltage Vn.

From time t3 to t6, AD conversion of the reset level of the pixel 100 is performed as a first AD conversion operation.

First, at time t3, the enable pulse PJEN is set to H level to allow the input to the holding circuit 123. Also, as the first reference signal VRAMP1, generation of a slope wave having a first slope at which the voltage increases in proportion to the elapse of time is started, and as the second reference signal VRAMP2, generation of a slope wave having the second slope at which the voltage increases in proportion to the elapse of time is started. As shown in FIG. 3B, the first slope is i times larger than the second slope. If i is a power of 2 (the first slope is a power of 2 to the second slope), it is convenient for bit shifting processing to be described later, so the first slope is 4 times larger than the second slope (i=4) in the present embodiment. At this time, since the holding circuit 123 is just reset, the reference signal selection pulse PRSEL is at L level, and thus the first reference signal VRAMP1 is outputted from the selection circuit 121 and input to the comparison circuit 122. Therefore, the comparison circuit 122 first compares an input voltage Vn with the first reference signal VRAMP1 which is a slope wave having a larger slope. Hereinafter, the comparison between the input voltage Vn and the first reference signal VRAMP1 is referred to as a first comparison operation. Meanwhile, simultaneously with the start of generation of the slope wave at time t3, the counter 15 starts counting.

At time t4, as the first reference signal VRAMP1 exceeds the input voltage Vn corresponding to the reset level of the pixels 100, an output COMP from the comparison circuit 122 is inverted from L level to H level. Upon detecting the inversion of the output COMP to H level, a count value N1 of the counter 15 at this point is acquired as a first digital value, and is held in the second memory 125 which is permitted to be written at this time.

Also, upon detecting the inversion of the output COMP to H level, the holding circuit 123 holds H level as the reference signal selection pulse PRSEL. Therefore, the reference signal selection pulse PRSEL transitions to H level, and the reference signal VRAMP input to the comparison circuit 122 is changed from the first reference signal VRAMP1 to the second reference signal VRAMP2 having a gentler slope shown by the solid line in FIG. 3B. The first comparison operation is terminated with the switching of the reference signal, and the comparison between the input voltage Vn and the second reference signal VRAMP2, which are started thereafter, is referred to as the second comparison operation. Since the reference signal VRAMP becomes lower than the signal voltage Vn as the reference signal VRAMP is switched to the second reference signal VRAMP2, the output COMP from the comparison circuit 122 transitions to L level. On the other hand, the holding circuit 123 continues to hold H level as the reference signal selection pulse PRSEL.

At time t5, as the second reference signal VRAMP2 exceeds the signal voltage Vn corresponding to the reset level of the pixel 100, the output COMP from the comparison circuit 122 is inverted from L level to H level again. Upon detecting the inversion of the output COMP to H level, the count value N2 of the counter 15 at this point is acquired as a second digital value, and is held in the third memory 126 which is permitted to be written at this time. The slope of the second reference signal VRAMP2 is set to 1/i (¼ in this case) with respect to the slope of the first reference signal VRAMP1. Therefore, the second digital value N2 held in the third memory 126 is a value of i times (here, four times) the first digital value N1.

As described above, in the first embodiment, slope waves with different slopes are simultaneously generated as a plurality of reference signals, and during the AD conversion of the reset level of the pixel 100, a reference signal is changed from a slope wave having a steep slope to a slope wave having a gentle slope and is input to the comparison circuit 122. Incidentally, the slope wave with a gentle slope starts to be generated at least before the generation period of the slope wave with a steep slope ends, preferably at the same time as the generation of the slope wave with the steep slope starts. As a result, AD conversion using both slope waves can be performed while preferably generating slope waves with different slopes at the same time. Therefore, it is possible to shorten the time required for the AD conversion operation for acquiring a plurality of digital values AD-converted by using a plurality of reference signals having different slopes.

At time t6, the second comparison operation and the AD conversion of the reset level of each of the pixels 100 are terminated, and the first reference signal VRAMP1, the second reference signal VRAMP2, and the count values of counter 15 are reset to the initial levels. In addition, the enable pulse PJEN is set to L level to prohibit input to the holding circuit 123. The enable pulse PMEN is set to L level, and the memory for which writing is permitted is switched from the third memory 126 to the first memory 124.

At time t7, the reset pulse PJRES of the holding circuit 123 is set to H level, and the reference signal selection pulse PRSEL held in the holding circuit 123 is reset to L level. As a result, the first reference signal VRAMP1 is output from the selection circuit 121 and input to the comparison circuit 122. At time t8, the reset pulse PJRES of the holding circuit 123 is set to L level to end the resetting of the holding circuit 123.

At time t9, the transfer pulse PTX of each of the pixels 100 in the selected row is set to H level, the transfer transistor 102 is turned on, and the electric charge generated according to the light incident on the photodiodes 101 is transferred to the floating diffusion capacitor 104 as an image signal. A voltage signal from the pixel 100 changes according to the charge amount transferred to the floating diffusion capacitor 104, and the input voltage Vin changes from the input voltage Vn corresponding to the reset level of the pixel to an input voltage Vs reflecting the image signal corresponding to the subject.

From time t10 to time t12, the luminance judging operation of a pixel signal of each pixel is performed, and the reference signal to be input to the comparison circuit 122 is selected for each A/D conversion circuit 120.

Specifically, first, at time t10, the transfer pulse PTX for each of the pixels 100 in the selected row is set to L level, the transfer transistor 102 is turned off, and charge transfer from the photodiode 101 to the floating diffusion capacitor 104 is terminated. Also, the enable pulse PJEN is set to H level to permit inputting to the holding circuit 123, and the first reference signal VRAMP1 is set to a determination level Vj of a predetermined level (fixed reference signal).

In the case where the determination level Vj exceeds the input voltage Vin corresponding to the voltage signal including the image signal of the pixel 100 (for example, when Vin=Vs1 in FIG. 3A), the output COMP from the comparison circuit 122 changes from L level to H level at time t11. Upon detecting the inversion of the output COMP to H level, H level is held as the luminance judgment value J in the holding circuit 123. Also, the reference signal selection pulse PRSEL transitions to H level, and the reference signal VRAMP input to the comparison circuit 122 switches from the first reference signal VRAMP1 to the second reference signal VRAMP2. On the other hand, when the determination level Vj does not exceed the input voltage Vin (for example, in the case of Vin=Vs2 in FIG. 3A), the output COMP from the comparison circuit 122 remains at L level and L level is held as the luminance judgment value J in the holding circuit 123. Also, the reference signal selection pulse PRSEL remains at L level, and the reference signal VRAMP input to the comparison circuit 122 remains the first reference signal VRAMP1.

At time t12, the enable pulse PJEN is set to L level to inhibit the input to the holding circuit 123. As a result, the level of the reference signal selection pulse PRSEL held in the holding circuit 123 is fixed, and the reference signal to be input to the comparison circuit 122 is determined for each A/D conversion circuit 120. Thereafter, at time t13, the first reference signal VRAMP1 is reset to the initial level.

Next, from time t14 to t16, AD conversion of the image signal level of each of the pixels 100 in the selected row is performed as the second AD conversion operation.

At time t14, the generation of the first reference signal VRAMP1 which is the slope wave of the first slope is started, and the generation of the second reference signal VRAMP2 which is the slope wave of the second slope is started. The slope of each slope wave is equal to that at the time of AD-converting the reset level, and the slope of the first slope wave is i times larger than the slope of the second slope wave. At this time, the reference signal selection pulse PRSEL is set to the level determined by the determination operation from time t10 to t12. Therefore, either the first reference signal VRAMP1 or the second reference signal VRAMP2 is output from the selection circuit 121 according to the level of the input voltage Vin and input to the comparison circuit 122.

Simultaneously with the start of generation of the slope wave at time t14, the counter 15 starts counting. In the case of Vin=Vs1, the output COMP from the comparison circuit 122 is inverted from L level to H level as the second reference signal VRAMP2 exceeds the input voltage Vin corresponding to the image signal of the pixel 100 at time t15. Similarly, when Vin=Vs2, the output COMP from the comparison circuit 122 is inverted from L level to H level as the first reference signal VRAMP1 exceeds the input voltage Vin corresponding to the image signal of the pixel 100. Upon detecting the inversion of the output COMP to H level, the count value S of the counter 15 at this point is acquired as a third digital value, and is held in the first memory 124 which is permitted to be written at this time.

At time t16, the AD conversion of the input voltage Vin corresponding to the image signal of the pixel 100 is ended, and the first reference signal VRAMP1, the second reference signal VRAMP2, and the count value of the counter 15 are reset to the initial levels.

At time t17, the reset pulse PRES of the pixel 100 is set to H level, the reset transistor 105 is turned on, and resetting of the floating diffusion capacitor 104 of the pixel 100 is started. Further, the reset pulse PC0R of the amplifier circuit 110 is set to H level, and resetting of the amplifier circuit 110 is started. At time t18, the selection pulse PSEL of the pixel 100 is set to L level, the selection transistor 106 is turned off, and the pixels 100 in the selected row are disconnected from the vertical output lines 107.

After time t16, the scanning signal PH is outputted from the horizontal scanning circuit 16, and luminance judgment value J, first digital value N1, second digital value N2, third digital value S are output from each A/D conversion circuit 120 to the signal processing unit 17.

In the signal processing unit 17, different signal processing is executed depending on which reference signal is used when the third digital value S is AD converted. Which reference signal is used in the AD conversion to obtain the third digital value S can be determined by referring to the luminance judgment value J. Here, it is possible to judge that AD conversion of the signal level S has been performed using the first reference signal VRAMP1 when the luminance judgment value J is L level, and that AD conversion of the signal level S has been performed using the second reference signal VRAMP2 when the luminance judgment value J is H level.

First, the selection circuit 170 selects the digital value AD-converted by using the same reference signal as the third digital value S among the first digital value N1 and the second digital value N2.

The selected digital value is inverted and input to one input terminal of addition circuit 171. The digital value S is input to the other input terminal of the addition circuit 171, and the S-N process for removing the reset level N from the signal level S is performed by adding them. As described above, in the signal processing unit 17 of the first embodiment, it is made possible to perform highly accurate S-N process by selecting the reset level N AD-converted by the same reference signal as the digital value S.

The digital value obtained as a result of the S-N process is input to a bit shift circuit 172. In the bit shift circuit 172, bit shift processing for aligning the gain ratio, caused by AD conversion, between the digital value AD-converted by the first reference signal VRAMP1 and the digital value AD-converted by the second reference signal VRAMP2 is performed. When a signal voltage of a certain level is AD-converted by the reference signal VRAMP1, the digital value thereof becomes 1/i of a value in the case where the signal of the same level is AD-converted using the second reference signal VRAMP2, which corresponds to a case where the AD conversion gain is multiplied by 1/i. Therefore, bit shift processing of $x = \log_2 i$ bits that corresponds to multiplying the signal AD-converted by the first reference signal VRAMP1 by a gain i is performed. For example, since i=4 in the first embodiment, the bit shift circuit 172 shifts the digital value AD-converted using the reference signal VRAMP1 by 2 bits and outputs the result. As for a digital value AD-converted by the second reference signal VRAMP2, it is output without undergoing the bit shift processing. Although the bit shift processing has been described as a technique for equalizing the gain ratio of the AD conversion, a correction method, other than the bit shift processing, that can finely adjust signals, such as gain correction for each column, may be used.

The above operation is the signal readout operation for one pixel row. The above operation is repeated for the number of rows while changing the pixel rows to which the control signal is sent from the vertical scanning circuit 13 to perform a reading operation of pixel signals for one frame.

According to the first embodiment as described above, slope waves having different slopes are generated in parallel as a plurality of reference signals. Then, each time one of the reference signals exceeds the reset level during a single AD conversion operation of the reset level, the reference signal to be referred to during the AD conversion processing is sequentially switched from one whose slope wave has a steeper inclination to one whose slope wave has a gentler inclination. Thus, it is possible to shorten the time required for the AD conversion operation for acquiring a plurality of digital values AD-converted using a plurality of reference signals having different slopes. In the present embodiment, it has been explained that the reference signals are changed in the descending order of inclination of slope wave from the steepest one to the gentlest one. However, the reference signals may be changed in the ascending order of inclination of slope wave from the gentlest one to the steepest one.

Second Embodiment

Next, a second embodiment of the present invention will be described. Since the configuration of the entire image sensor and the pixel circuit in the second embodiment are the same as those of the image sensor shown in FIGS. 1A and 1B described in the first embodiment, the description thereof is omitted. In the second embodiment, the configuration of the amplifier circuits 110 of the amplification unit 11 and the configuration of the A/D conversion circuits 120 in the A/D converter 12 are different from those described with reference to FIG. 2 in the first embodiment. The circuit configurations of the amplifier circuit 110, the A/D conversion circuit 120, and the signal processing unit 17 of the image sensor 1 in the second embodiment will be described below with reference to the block diagram of FIG. 4.

Figure 4:
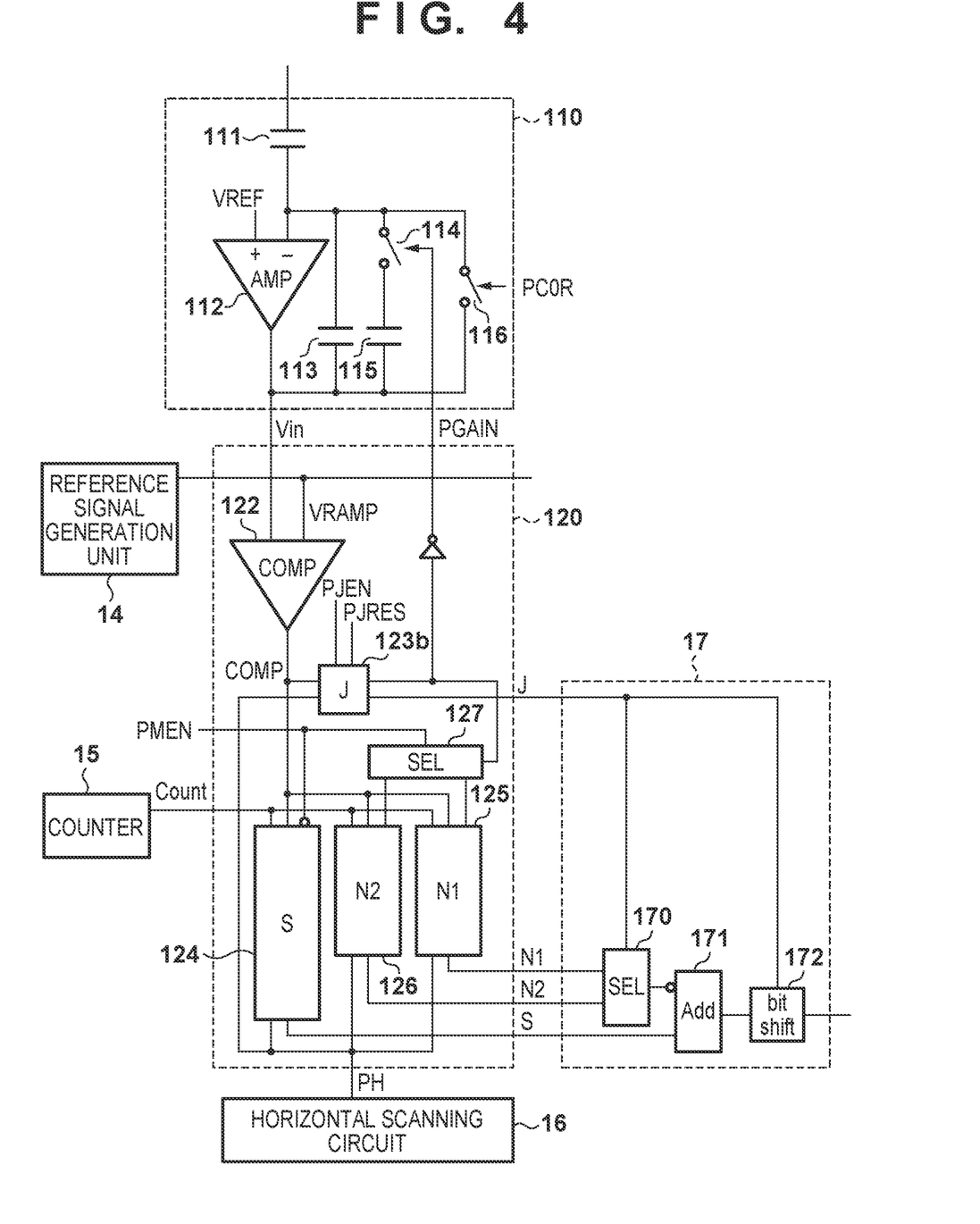
FIG. 4 is a block diagram showing a circuit configuration of an A/D conversion circuit, an amplifier circuit, and a signal processing unit of an image sensor according to a second embodiment.

As shown in FIG. 4, the amplifier circuit 110 in the second embodiment includes capacitors 111, 113, and 115, an operation amplifier 112, a gain changeover switch 114, and a reset switch 116.

The capacitor 111 has capacitance C0, the capacitor 113 has capacitance C1, and the capacitor 115 has capacitance C2. The operation amplifier 112 together with the capacitors 111, 113, 115 constitutes a differential amplifier circuit, and inverts a difference between the input voltage input to the inverting input terminal and the reference power VREF input to the non-inverting terminal, and outputs the result.

The gain changeover switch 114 is controlled by a gain switching pulse PGAIN supplied from the A/D conversion circuit 120, and switches the amplification factor of the differential amplifier circuit by switching the connection state of the capacitor 115. When the gain changeover switch 114 is turned on by setting the gain switching pulse PGAIN to H level and the capacitor 115 is connected, the amplification factor of the differential amplifier circuit becomes a first gain of C0/(C1+C2). When the gain changeover switch 114 is turned off by setting the gain switching pulse PGAIN to L level and the capacitor 115 is disconnected, the amplification factor of the differential amplifier circuit becomes a second gain of C0/C1. The second gain is (C1+C2)/C1 times the first gain. It is convenient for a bit shift process to be described later to set (C1+C2)/C1 to a power of 2. Therefore, for the sake of simplicity of explanation, in the second embodiment, the case where the capacitance C2 of the capacitor 115 is set to three times the capacitance C1 of the capacitor 113 will be described as an example. When the capacitance C2 is set to be three times the capacitance C1, the second gain has an amplification factor four times as large as the first gain. However, the ratio of capacitance between the capacitors 113 and 115 is not limited thereto.

The reset switch 116 is controlled by the reset pulse PC0R and causes the amplifier circuit 110 to be reset.

With the amplifier circuit 110 having the above configuration, a voltage signal output from the pixel 100 is inverted and amplified at the amplification factor set by the gain switching pulse PGAIN and input to the A/D conversion circuit 120 as the input voltage Vin.

Next, the configuration of the A/D conversion circuit 120 in the second embodiment will be described. In a comparison circuit 122, an input voltage Vin and a reference signal VRAMP are input. In the second embodiment, the reference signal generation unit 14 generates one type of reference signal VRAMP, and the selection circuit 121 provided in the first embodiment is not provided in the A/D conversion circuit 120 of the second embodiment.

A holding circuit 123b generates a gain switching pulse PGAIN and holds a control signal for controlling the amplification factor of the amplifier circuit 110. The inverting value of the gain switching pulse PGAIN held in the holding circuit 123b is supplied to the amplifier circuit 110. The holding circuit 123b stores H level as the gain switching pulse PGAIN at the timing when the output signal COMP of the comparison circuit 122 is inverted from L level to H level while the enable pulse PJEN is at H level. After that, it keeps H level regardless of the output of the comparison circuit 122. Also, when a reset pulse PJRES becomes H level, the gain switching pulse PGAIN stored in the holding circuit 123b is reset to L level. In addition, the holding circuit 123b holds the luminance judgment value J obtained by a luminance judging operation to be described later.

Other constituents of the A/D conversion circuit 120 in the second embodiment are the same as those in the A/D conversion circuit 120 shown in the first embodiment. In addition, the circuit configuration of a signal processing unit 17 in the second embodiment is the same as that of the signal processing unit 17 described in the first embodiment.

Figure 5A:
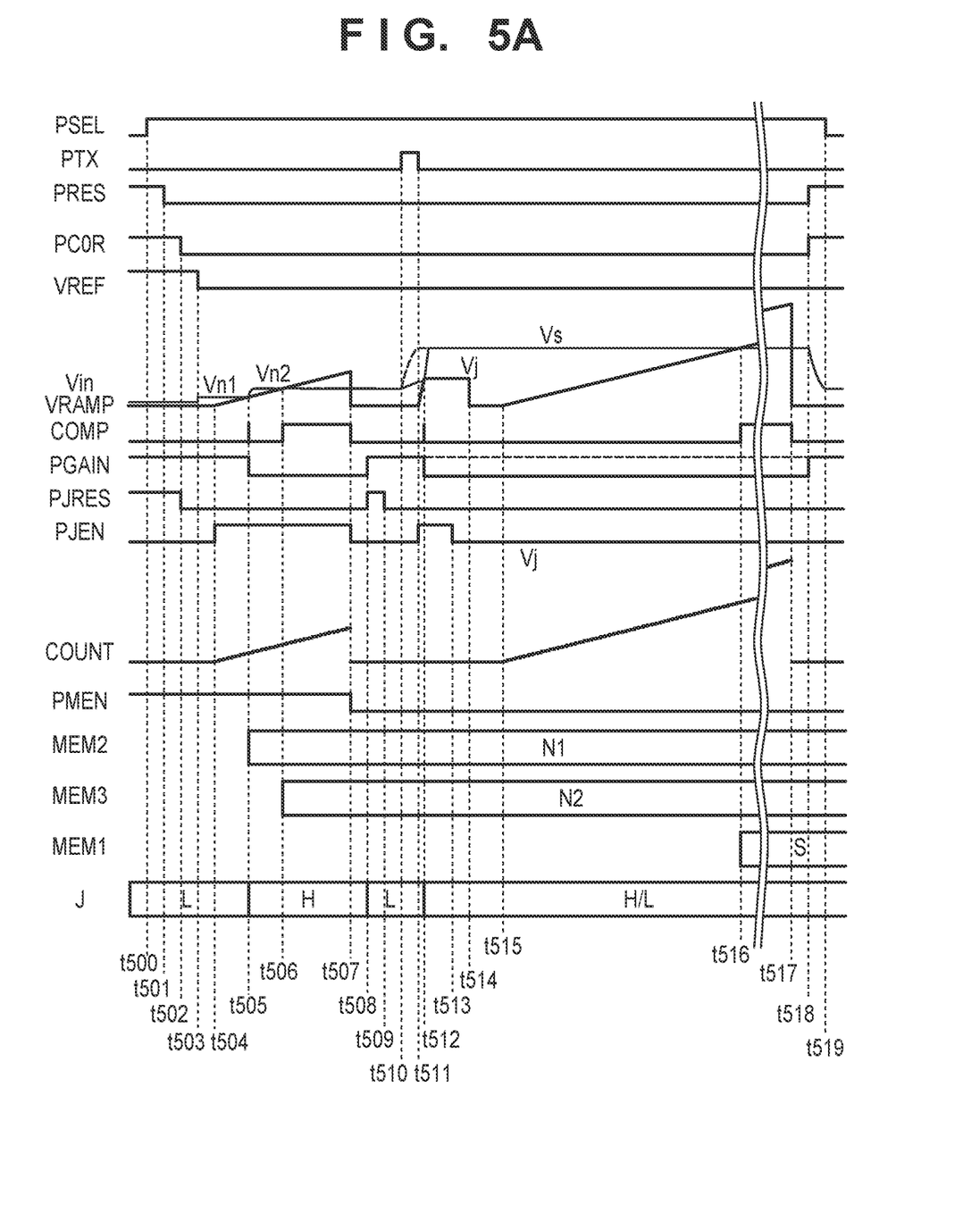
FIG. 5A is a timing chart showing a signal readout operation according to the second embodiment.
Figure 5B:
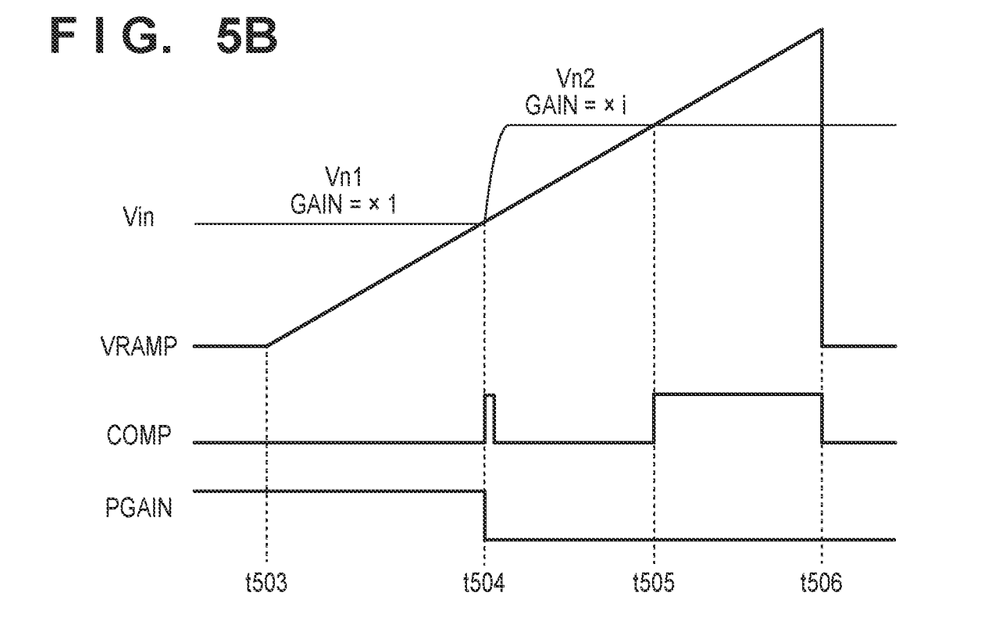
FIG. 5B is a timing chart showing a signal readout operation according to the second embodiment.

FIGS. 5A and 5B are timing charts showing a signal readout operation in the second embodiment, and FIG. 5A is a timing chart of a reading operation of pixel signals for one row. FIG. 5B is a timing chart showing a portion corresponding to the characteristic operation in the second embodiment extracted from the timing chart of FIG. 5A.

The operation from time t500 to t502 is similar to the operation from time t0 to t2 in FIG. 3A described in the first embodiment.

At time t503, the level of the reference power supply VREF is lowered. This is performed for the sake of providing an offset between the input voltage to the amplifier circuits 110 and the reference power VREF in order to ensure that the voltage Vin output from the amplifier circuit 110 is always amplified in the positive direction when the gain of the amplifier circuit 110 is switched from a low gain to a high gain.

From time t504 to time t507, AD conversion of the reset level of the pixel 100 is performed as the first AD conversion operation.

First, at time t504, the enable pulse PJEN is set to H level, thereby allowing to input a signal to the holding circuit 123b. Also, a slope wave is generated in the reference signal VRAMP. At this time, since the holding circuit 123b is immediately after being reset, the gain switching pulse PGAIN is at L level, and the gain switching pulse PGAIN input to the gain changeover switch 114 is at H level which is the inverted value thereof. Therefore, a first gain that is a low gain is set in the amplifier circuit 110. Accordingly, the comparison circuit 122 firstly compares the slope wave of the reference signal VRAMP with an input voltage Vn1 that is obtained by amplifying a reset level of the pixel 100 by the low amplification factor and input as the input voltage Vin. Hereinafter, the comparison between the input voltage Vn1 and the reference signal VRAMP is referred to as a first comparison operation. As described above, in the second embodiment, the amplification factor of the first gain is set to ¼ of the second gain. Meanwhile, simultaneously with the start of generation of the slope wave at time t504, the counter 15 starts counting.

At time t505, as the reference signal VRAMP exceeds the input voltage Vn1 which is obtained by amplifying the reset level of the pixel 100 by the first gain, the output COMP of the comparison circuit 122 is inverted from L level to H level. Upon receiving the inversion of the output COMP to H level, a count value N1 of the counter 15 at this point is acquired as a first digital value, and is held in the second memory 125 which is permitted to be written at this time. In addition, upon receiving the inversion of the output COMP to H level, the holding circuit 123b holds H level as the gain switching pulse PGAIN. Accordingly, as shown in FIG. 5B, the gain switching pulse PGAIN input to the amplifier circuits 110 transitions to L level, and during the occurrence of the slope wave, the gain of the amplifier circuit 110 is switched to the second gain which is i=4 times higher than the first gain. As the gain is switched, the first comparison operation ends. The comparison operation performed with the second gain which is started thereafter is referred to as a second comparison operation. As a gain used in the amplifier circuit 110 is switched to the second gain, the input voltage Vin changes from the voltage Vn1 to a voltage Vn2 and exceeds the reference signal VRAMP, and the output COMP of the comparison circuit 122 transitions to L level. On the other hand, the holding circuit 123b continues to hold H level as the gain switching pulse PGAIN.

At time t506, as the reference signal VRAMP exceeds the input voltage Vn2 which is obtained by amplifying a voltage signal corresponding to the reset level of the pixels 100 amplified by a high amplification factor, the output COMP of the comparison circuit 122 inverts from L level to H level again. Upon receiving the inversion of the output COMP to H level, a count value N2 of the counter 15 at this point is acquired as a second digital value, and is held in the third memory 126 which is permitted to be written at this time. Since the amplification factor of the second gain is set to i=4 times the first gain, the second digital value N2 held in the third memory 126 is four times the first digital value N1.

As described above, in the second embodiment, in the AD conversion operation of the reset level of the pixel 100, the gain of the amplifier circuit 110 is changed from the first gain with a low amplification factor to the second gain with a high amplification factor during the slope wave is generated. In this way, it is possible to shorten the time required for the AD conversion operation for acquiring a plurality of digital values through AD conversion using a plurality of gains having different amplification factors.

The operation at time t507 is the same as the operation at time t6 in the first embodiment.

At time t508, the reset pulse PJRES of the holding circuit 123b is set to H level, and the gain switching pulse PGAIN held in the holding circuit 123b is reset to L level. As a result, the gain switching pulse PGAIN supplied to the amplifier circuit 110 becomes H level, and the gain of the amplifier circuit 110 is set to the first gain that is the low gain.

The operation from time t509 to t510 is the same as the operation from time t8 to t9 in the first embodiment.

From time t511 to time t513, the luminance judging operation of the pixel signal of each pixel is performed, and the gain of the amplifier circuit 110 is selected for each amplifier circuit 110.

Specifically, first, at time t511, the transfer pulse PTX of pixel 100 is set to L level to turn off the transfer transistor 102, and charge transfer from the photodiode 101 to the floating diffusion capacitor 104 is terminated. Further, the enable pulse PJEN is set to H level to permit inputting to the holding circuit 123b, and the reference signal VRAMP is set to a determination level Vj of a predetermined level (fixed reference signal).

During the period from time t511 to time t513, an input voltage Vs reflecting an image signal of the pixel 100 is compared with the determination level Vj, and when the determination level Vj exceeds the input voltage Vs, the output COMP of the comparison circuit 122 changes from L level to H level. Upon receiving the inversion of the output COMP to H level, H level is held as the luminance judgment value J in the holding circuit 123b. In addition, since the gain switching pulse PGAIN transitions to H level, the gain switching pulse PGAIN input to the amplifier circuit 110 becomes L level and the gain of the amplifier circuit 110 is switched from the first gain, which is a low gain, to the second gain, which is a high gain. On the other hand, when the determination voltage Vj does not exceed the input voltage Vs which is as the input voltage Vin, the output COMP of the comparison circuit 122 remains at L level, as indicated by the broken line, and the holding circuit 123b holds L level as the luminance judgment value J. In addition, the gain switching pulse PGAIN held in the holding circuit 123b remains at L level, the gain switching pulse PGAIN to be input to the amplifier circuit 110 becomes H level, and the gain of the amplifier circuit 110 remains to be the first gain which is a low gain.

At time t513, the enable pulse PJEN is set to L level to prohibit inputting to the holding circuit 123b, the level of the holding circuit 123b, that is, the level of the gain switching pulse PGAIN is fixed, and the gain for each amplifier circuit 110 is also fixed. Thereafter, at time t514, the reference signal VRAMP is reset to the initial level.

Next, from time t515 to time t517, AD conversion of the image signal level of the pixel 100 is performed as a second AD conversion operation.

At time t515, the slope wave starts generated in the reference signal VRAMP. At this time, the gain switching pulse PGAIN held in the holding circuit 123b is set to the level determined by the determination operation performed from time t511 to time t513. Therefore, the amplifier circuit 110 is set to the first gain or the second gain according to the input voltage Vs amplified with the first gain, and the voltage Vs amplified with the set gain is outputted from the amplifier circuit 110 and input to the comparison circuit 122 as an input voltage Vin.

Simultaneously with the start of generation of the slope wave at time t515, the counter 15 starts counting. The operation from time t516 to time t519 is the same as the operation from time t15 to time t18 in the first embodiment.

A scanning signal PH is outputted from the horizontal scanning circuit 16 after time t517 when the AD conversion of the image signal level of the pixel 100 is completed, and the luminance judgment value J, the third digital value S, the first digital value N1, and the second digital value N2 are output from each A/D conversion circuit 120 to the signal processing unit 17.

In the signal processing unit 17, different signal processing is executed depending on which gain is set when the third digital value S is AD-converted. The gain used when the third digital value S is AD-converted can be determined by referring to the luminance judgment value J. Here, it can be judged that the AD conversion of the signal level S has been performed using the first gain when the luminance judgment value J is at L level, and using the second gain when the luminance judgment value J is at H level.

First, the selection circuit 170 selects from among the first digital value N1 and the second digital value N2 the digital value AD-converted with the same gain used when the third digital value S is AD-converted.

The selected digital value is inverted and input to one of the input terminals of the addition circuit 171. The digital value S is input to the other input terminal of the addition circuit 171, and an S-N process for removing the reset level N from the signal level S is performed by adding them. As described above, the signal processing unit 17 of the second embodiment makes it possible to perform the S-N process with high accuracy by selecting the reset level N AD-converted using the same gain used when the digital value S is AD converted.

The S-N processed digital value is input to the bit shift circuit 172. In the bit shift circuit 172, a bit shift process is performed to equalize the gain ratio between the digital value AD-converted using the first gain and the digital value AD-converted using the second gain. When a signal voltage of a certain level is amplified using the first gain and AD-converted, the digital value is 1/i of a digital value in the case of assuming that the signal of the same level is amplified by the second gain and AD-converted (here, ¼). Therefore, the bit shift processing of $x=\log_2 i$ bits which corresponds to multiplying the signal AD-converted using the first gain by i times gain is performed. For example, since i=4 in the second embodiment, the bit shift circuit 172 shifts the digital value AD-converted using the first gain by 2 bits and outputs the result. The digital value AD-converted using the second gain is output without carrying out the bit shift. Although the bit shift processing has been described as a technique for equalizing the gain ratio by the AD conversion, a correction method, other than the bit shift processing, that can finely adjust signals, such as gain correction for each column, may be used.

The above operation is the signal readout operation for one pixel row. The above operation is repeated for the number of rows while changing the pixel rows to which the control signal is sent from the vertical scanning circuit 13 to perform a reading operation of pixel signals for one frame.

According to the second embodiment as described above, in the AD conversion operation of the reset level of the pixel 100, the gain of the amplifier circuit is changed from a lower gain to a higher gain each time the reference signal exceeds the reset level during the slope wave is generated. Thus, it is possible to shorten the time required for the AD conversion operation for acquiring a plurality of digital values AD-converted using a plurality of gains having different amplification factors.

Third Embodiment

Figure 6:
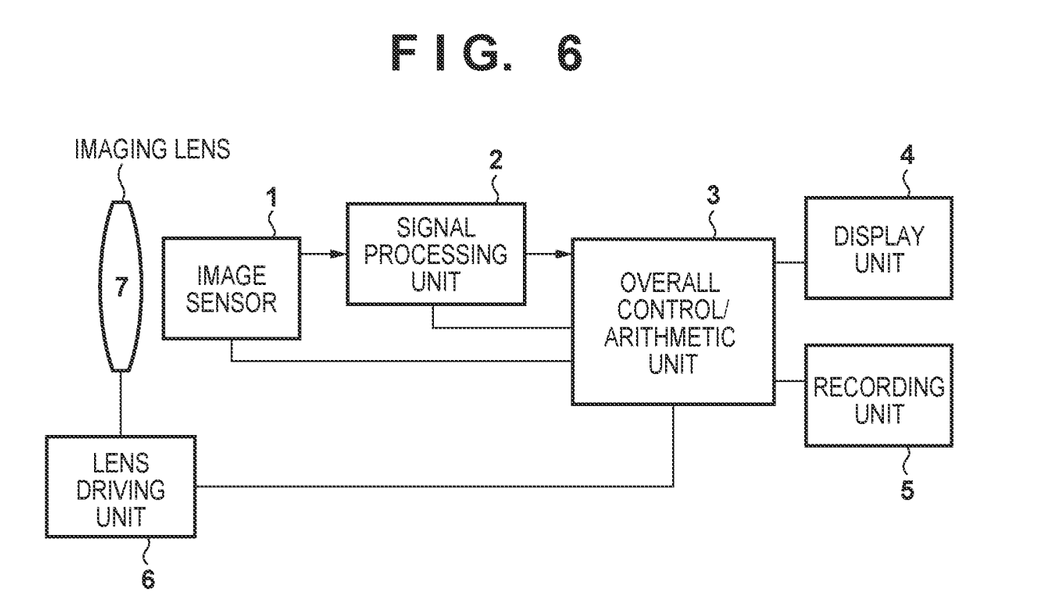
FIG. 6 is a block diagram showing a configuration of an image sensing apparatus according to an embodiment.

Next, a third embodiment of the present invention will be described. FIG. 6 is a block diagram showing a configuration of an image sensing apparatus, in which the image sensor 1 described in the first and second embodiments is used.

A signal processing unit 2 performs signal processing such as correction and development on a signal output from the image sensor 1. An overall control/arithmetic unit 3 sends an instruction to each part of the image sensing apparatus, including the image sensor 1, and performs arithmetic processing necessary for controlling each part. A display unit 4 displays captured images and the like developed by the signal processing unit 2. A recording unit 5 records the captured images developed by the signal processing unit 2. A lens driving unit 6 receives an instruction from the overall control/arithmetic unit 3, and drives an imaging lens 7. The imaging lens 7 forms a subject image on an imaging surface of the image sensor 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-076819, filed on Apr. 7, 2017 which is hereby incorporated by reference herein in its entirety.

What is claimed is:

1. An image sensing apparatus comprising:
a pixel unit;
a generator that generates and outputs a plurality of reference signals having different slopes from each other that start at a same time and increase in proportion to elapsation of time;
a selector that selects one of the plurality of reference signals; and
an analog-to-digital converter that converts an analog signal outputted from the pixel unit to a digital signal using the reference signal selected by the selector,
wherein the generator generates the plurality of reference signals in parallel, and
wherein, in a case where an analog signal of a reset level is outputted from the pixel unit, the selector changes the reference signal selected from the plurality of reference signals each time the selected reference signal exceeds the analog signal of the reset level while converting the analog signal of the reset level.

2. The image sensing apparatus according to claim 1, further comprising an adder that subtracts a digital signal of the reset level converted by the analog-to-digital converter from a digital signal obtained by converting an image signal outputted as an analog signal from the pixel unit by the analog-to-digital converter,
wherein the generator further generates and outputs a fixed reference signal of a predetermined level,
upon converting the image signal by the analog-to-digital converter, the selector selects a first reference signal from the plurality of reference signals in a case where the fixed reference signal does not exceed the image signal, and selects a second reference signal having a gentler slope than the first reference signal from the plurality of reference signals in a case where the fixed reference signal exceeds the image signal, and
the adder subtracts the digital signal of the reset level which has been converted when the reference signal having a same slope as the reference signal selected at a time of converting the image signal is selected.

3. The image sensing apparatus according to claim 2, wherein the slope of the first reference signal with respect to the slope of the second reference signal is a power of 2.

4. The image sensing apparatus according to claim 1, further comprising a signal processing unit that processing a signal output from the analog-to-digital converter.

5. A control method for an image sensing apparatus that comprises a pixel unit; a generator capable of generating and outputting a plurality of reference signals having different slopes from each other that start at a same time and increase in proportion to elapsation of time, a selector that selects one of the plurality of reference signals, and an analog-to-digital converter that converts an analog signal outputted from the pixel unit to a digital signal using the reference signal selected by the selector, the method comprising, in a case where an analog signal of a reset level is outputted from the pixel unit,
generating the plurality of reference signals in parallel;
changing a reference signal selected from the plurality of reference signals; and
converting the analog signal of the reset level to a digital signal using each of the selected reference signals,
wherein the reference signal is changed each time the selected reference signal exceeds the analog signal of the reset level while converting the analog signal of the reset level.

* * * * *